United States Patent [19]
Oshita et al.

[11] Patent Number: 5,199,881
[45] Date of Patent: Apr. 6, 1993

[54] HERMAPHRODITIC INTERCONNECTION OF CIRCUIT BOARDS

[75] Inventors: Felix M. Oshita, Santa Ana; Ronald L. Campbell; Theodore R. Conroy-Wass, both of Tustin, all of Calif.

[73] Assignee: Hughes Aircraft Company, Los Angeles, Calif.

[21] Appl. No.: 801,977

[22] Filed: Dec. 3, 1991

[51] Int. Cl.$^5$ .............................................. H01R 9/09
[52] U.S. Cl. ...................................... 439/65; 439/67; 439/77; 439/91; 439/493
[58] Field of Search .................... 439/59, 62, 65, 67, 439/74, 77, 79, 91, 284, 287, 289, 489, 493, 499

[56] References Cited

U.S. PATENT DOCUMENTS

| | | | |
|---|---|---|---|
| 4,125,310 | 11/1978 | Reardon et al. | 339/92 M |
| 4,453,795 | 6/1984 | Moulin | 339/92 M |
| 4,776,804 | 10/1988 | Johnson et al. | 439/79 |
| 4,906,197 | 3/1990 | Noll | 439/79 |
| 4,934,941 | 6/1990 | Okada | 439/65 |
| 4,991,290 | 2/1991 | MacKay | 439/91 |
| 5,017,146 | 5/1991 | Uehara et al. | 439/65 |

*Primary Examiner*—Paula A. Bradley
*Attorney, Agent, or Firm*—Elizabeth E. Leitereg; Terje Gudmestad; Wanda K. Denson-Low

[57] ABSTRACT

Boards of a first group of mutually parallel circuit boards (200,206) are directly connected to boards (27a,22b) of a second group of mutually parallel circuit boards by interfitting hermaphroditic connectors (24,26,28,30) mounted on edges of the boards. The boards of one group are all perpendicular to the boards of the other group and are positioned in edge-to-edge relation. Each board has a plurality of hermaphroditic connectors secured to its edge, with each connector adapted to mate with an identical hermaphroditic connector secured at an edge of a board of the second group. The hermaphroditic connectors are each substantially U-shaped (24,26,28,30) in one embodiment and J-shaped (126,128,130) in another embodiment. Each such connector has a first section (66,68) parallel to the surface of the board and electrically connected thereto and a second section (70) extending at right angles to the first section for a pressure type connection to the similar second section of the mating hermaphroditic connector of a board of the second group. The mating second sections (70,70b) of the two mating connectors have pressure contact connection elements in the form of raised elongated strips (220,222) of conductive material that ease positioning tolerance of the interconnection.

32 Claims, 5 Drawing Sheets

HERMAPHRODITIC INTERCONNECTION OF CIRCUIT BOARDS

BACKGROUND OF THE INVENTION

1. Field of the Invention

The present invention relates to interconnection of electrical parts and more particularly concerns hermaphroditic electrical connectors for connection of components or circuit boards to other components or other circuit boards.

2. Description of Related Art

As functions and operations of electronic equipment expand in scope and complexity, greater amounts of circuitry are necessarily employed. Circuit boards become larger, and increased numbers of such boards are employed. For example, very large capacity computers which embody massive parallel processing of data and massive parallel computational operations may employ large numbers of identical, or nearly identical, circuits. Often groups of similar or identical circuits are mounted on each of a large number of circuit boards. In a common type of multiple board packaging arrangement, boards of a group of mutually parallel daughter boards are positioned in parallel planes that are perpendicular to one side of a mother board, and a second group of such parallel daughter boards lie in planes perpendicular to the opposite side of the mother board. System operation requires the ability to interconnect circuits on one daughter board to circuits on another daughter board. The mother board is provided to afford such interconnections. Thus, a circuit on one daughter board is connected to a circuit on a second daughter board by a connection between the first daughter board and the mother board, appropriate circuitry in the mother board and a connection between circuitry of the mother board and the second daughter board. Such arrangements require rather complex and costly termination processes and hardware for interconnection of the daughter boards to the mother board. Importantly, length and impedance of the circuit path between the two interconnected daughter boards varies depending upon the location of the daughter boards with respect to one another and with respect to the interposed mother board. The path length of the connection between two daughter boards depends to a large extent upon the length of the interconnection path that is provided within the interposed mother board itself. Such varying path lengths introduce varying impedance and varying timing so that it may be necessary in some cases to introduce compensating timing circuits that account for differences in the time required for signals to traverse different ones of the circuit paths that interconnect daughter boards. Moreover, the required use of the interposed mother board and its circuits adds further to cost and complexity of the assembly.

Accordingly, it is an object of the present invention to provide for connection of electrical components such as a circuit board to other components, such as another circuit board, by processes and hardware that avoid or eliminate above mentioned problems.

SUMMARY OF THE INVENTION

In carrying out principles of the present invention in accordance with an exemplary embodiment thereof first and second hermaphroditic connectors each has a first section connected to a first one of the components to be interconnected and a second section that is transverse to the first section. The first section is electrically connected to its component or board, and the second section bears a pattern of pressure contacts which are pressed against pressure contacts of the second section of a mating hermaphroditic connector, which itself has a connection to a second circuit board or component to be connected. In a specific application to multi-board interconnection, the edge of each board of a group of circuit boards lying in mutually parallel planes is provided with a group of hermaphroditic connectors, and each board of a second group of circuit boards lying in mutually parallel planes that are transverse to the planes of the boards of the first group is also provided with a group of hermaphroditic connectors. The boards of the first group are pressed against boards of the second group so that the hermaphroditic connectors have similar pressure contacts thereof pressed against one another to make a suitable electrical connection. According to another feature of the invention, increased mechanical tolerance is provided by employing elongated raised conductive strips for the pressure contacts so that strips of one connector part are positioned at right angles to the strips of the mating connector part. Moreover, those elongated conductive strips are applicable for connection of many different types of boards and components.

DESCRIPTION OF THE PREFERRED EMBODIMENTS

Figure 1:
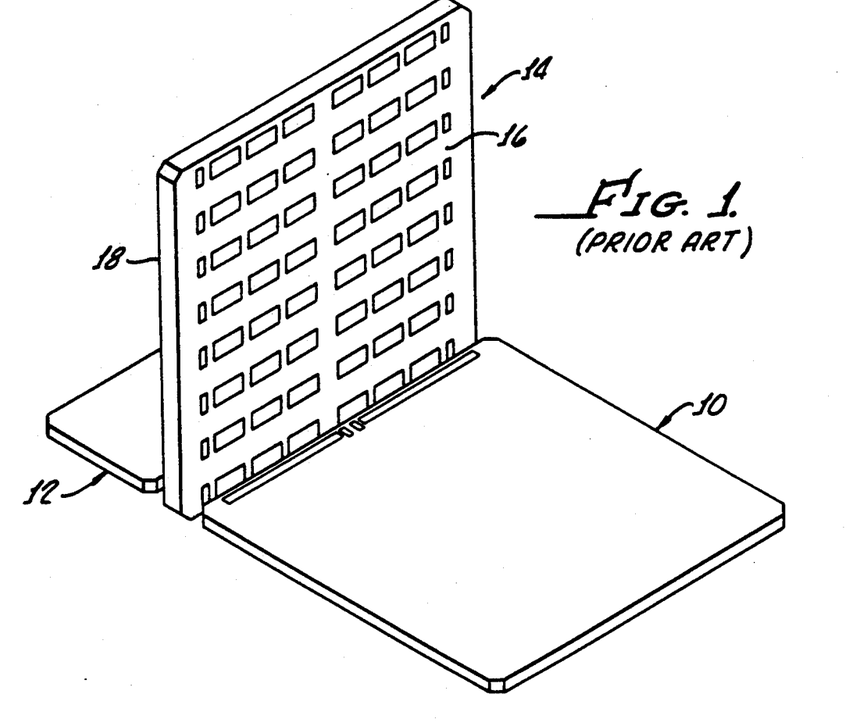
FIG. 1 illustrates a prior art arrangement of interconnection of daughter boards to one another through the intermediary of a mother board.

FIG. 1 shows an arrangement of the prior art in which a first group of daughter boards, generally indicated at 10, which may comprise as many as twenty or more mutually parallel and mutually spaced boards are connected to boards of a second group, generally indicated at 12, which similarly consists of a large number of mutually parallel mutually spaced boards. Interconnections of boards of one group to boards of the other group are made by means of a single interposed mother board 14. Boards of the first group 10 are positioned normal to a first surface of the mother board and have electrical connections on their edges which connect to contacts on a first surface 16 of the mother board. Similarly, boards of the second group 12 have standard connection elements on their edges which connect to connecting elements on the opposite surface 18 of the mother board. A connecting circuit path from a board of the first group to a board of the second group goes from the edge connector of the board of the first group to the mother board, then through circuitry formed in the mother board, and thence through the connection between the board of the second group and the other side of the mother board. The length of the circuit path of connecting circuits in the mother board varies according to which boards of one group are connected to which boards of the other group, and thus impedance and timing vary significantly from one interconnection to another.

Figure 2:
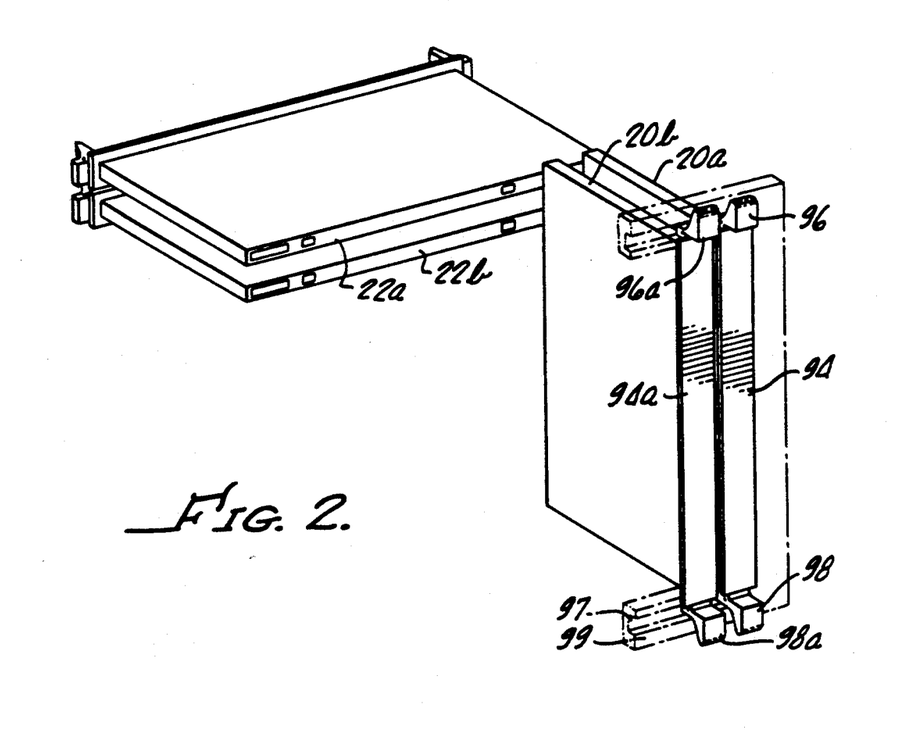
FIG. 2 illustrates an arrangement for directly connecting the groups of daughter boards to one another by hermaphroditic connectors on board edges.

In accordance with one feature of the invention, daughter boards of one group are directly connected to daughter boards of another group by arranging the boards of one group to lie in planes that are transverse to or, more specifically, perpendicular to planes of the boards of the second group. The arrangement enables use of hermaphroditic connectors for connection of each board to one or more of the boards of the other group. The term hermaphroditic is used herein to describe a connector that is neither merely a male nor a female connector but which has, effectively, both male and female parts that enable one connector to mate with an identical connector. Thus, as illustrated in FIG. 2, boards such as boards 20a and 20b of a first group lie in mutually parallel planes which are illustrated in FIG. 2 as vertical, whereas boards such as boards 22a and 22b of a second group lie in planes perpendicular to the planes of boards of the first group. Although only two boards are illustrated in each group, it will be readily understood that the boards may be of any reasonable number, up to as many as twenty or more in each group.

Each board has mounted to an edge thereof a plurality of spaced hermaphroditic connectors. All connectors are identical for all boards and all groups of board. The hermaphroditic connectors are so configured and arranged that when they are oriented at right angles to one another, as when the boards of one group are oriented at right angles to boards of another group, as illustrated in FIG. 2, two hermaphroditic connectors will directly mate with one another to make a firm, secure electrical contact directly from one board to the other. All of the hermaphroditic connectors are identical and connected to their respective boards in the same manner. Connections are made directly from one board to another, without any intervening member, such as a mother board, and the lengths of circuit paths to the connectors from each board are the same. Therefore, there is no varying length intermediate circuit path between the directly interconnected circuit boards.

Figure 3:
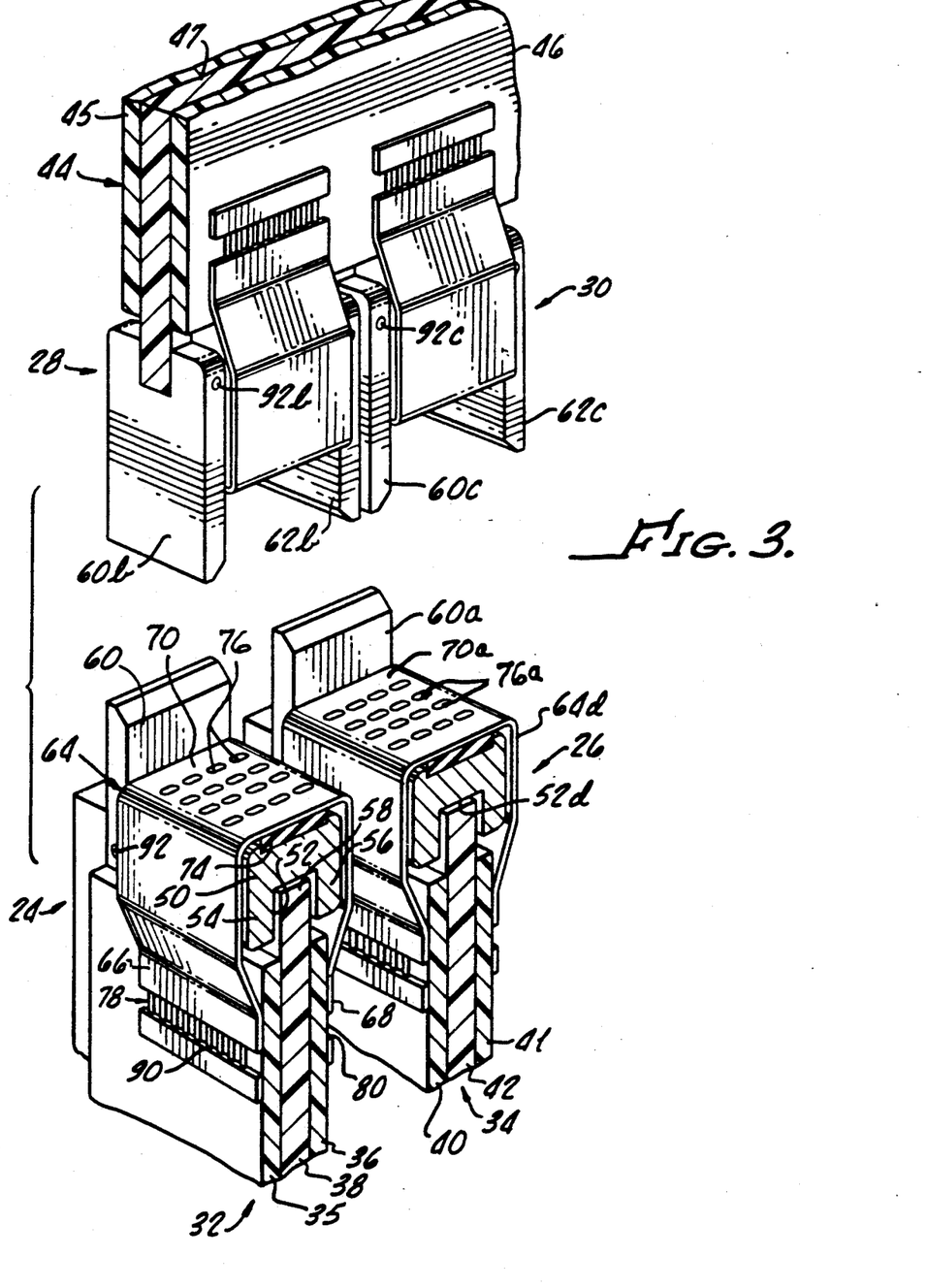
FIG. 3 is an exploded pictorial illustration of edge-to-edge board interconnection using hermaphroditic connectors on edges of double sided circuit boards.

Two adjacent pairs of hermaphroditic connectors, for use with boards arranged as in FIG. 2, and portions of the boards to which they are secured are illustrated in the exploded view of FIG. 3. All connectors are hermaphroditic and identical. Interconnection of one connector with another is achieved by turning two connectors at right angles to each other. This occurs upon orientation of the boards to which they are connected at 90°. When so oriented relative to one another electrical connection is made by simply pressing the two connectors against each other.

FIG. 3 illustrates four identical connectors generally identified at 24, 26, 28, and 30. Connectors 24 and 26 are each connected to different ones of two parallel boards 32,34, each of which is double sided and includes first and second boards 35,36 sandwiching an interposed heat sink 38 for board 32 and boards 40,41 sandwiching an interposed heat sink 42 for board 34. Each of the connectors 28,30 are connected to the edge of a single board 44 comprising a double sided board composed of first and second boards 45,46 on either side of an interposed heat sink 47. Board 44 lies in a plane that is perpendicular to each of the parallel planes of boards 32,34. The arrangement is such that the hermaphroditic connectors are secured to the edges of the boards and are arranged to directly connect board 44 to each of board 32,34. Connector 28 mates with connector 24 and connector 30 mates with connector 26.

Hermaphroditic connector 24, which, as previously stated, is identical to each of the hermaphroditic connectors 26,28 and 30, includes a structural fixture having a fixture body 50, which in the illustration shown has a U-shaped recess 52 formed by depending legs 54,56 that straddle the upper edge 58 of heat sink 38, which is received in the recess 52. Fixture body 50 has rigidly secured thereto spaced upstanding flanges, such as flanges 60 and a similar flange, not seen in connector 24 in FIG. 3. As all of the four connectors illustrated in FIG. 3 are identical to one another, similar reference numerals are applied to corresponding parts but distinguish the four connectors illustrated in FIG. 3 by the use of a suffix "a", "b" or "c" for respective connectors 26, 28 and 30. Thus the second upstanding connector flange of connector 24, which is not shown in FIG. 3, is equivalent to upstanding flanges 62b and 62c of connectors 28 and 30. The fixture body 50 extends between the connector flanges.

Straddling the connector body 50 is a flexible (flex) circuit 64 having first and second board connecting sections 66 and 68 and an intermediate interconnecting section 70, collectively forming a U-shaped flexible circuit. A strip of elastomer 74 is interposed between the fixture body 50 and intermediate section 70 of the flex circuit to provide a resiliently deformable backing under a group of raised interconnection contacts, generally indicated at 76, provided on the intermediate section 70. Ends of flex circuit 64 have conventional board connections, generally indicated at 78 and 80, for flexible circuit sections 66 and 68, respectively. Various types of connector to board connection elements may be employed for connections 78,80, including solder pins on the board soldered to holes in the flex circuit or solder fingers such as fingers 90 of FIG. 3 that are soldered to pads on the board. The flex circuit includes embedded conductive elements or circuit traces that electrically connect the interconnection contacts 76 to the board connection elements 90. If deemed necessary or desirable, springs (not shown) may be interposed between fixture body 50 and the upper edge of circuit board 32 to ensure that all connector raised contacts are pressed resiliently into electrical contact when perpendicular boards are pressed against each other.

Figure 6:
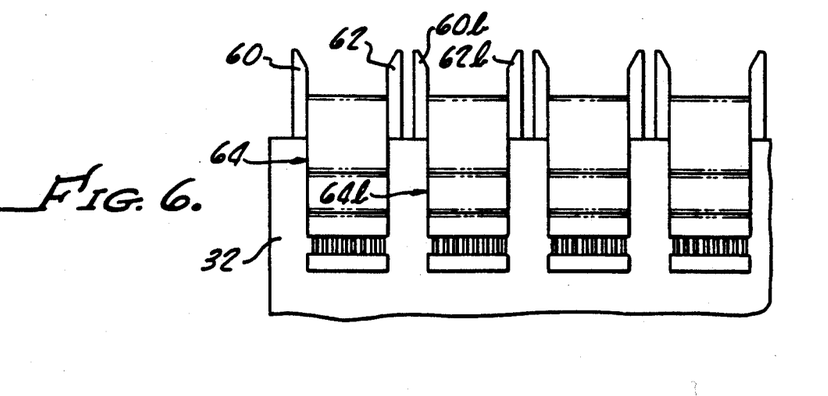
FIG. 6 is a pictorial illustration of a fixture that may be common to a plurality of hermaphroditic connectors.

Although each connector may be made as a separate connector, including its connector fixture body 50 with a pair of flanges 60 and 62 flanking the U-shaped flexible circuit with its interposed elastomer, it is convenient in some arrangements to make the fixture 50 as a single integral elongated body, as illustrated in FIG. 6, having a plurality of pairs of upstanding flanges, such as 60 and 62, and succeeding pairs, such as 60b and 62b, integrally formed with the body and spaced therealong. Thus, an integral single connecting fixture can be suitably secured to the double sided board 32 in any suitable fashion, such as by means of pins 92, 92b, 92c (FIG. 3). Between each pair of flanges a strip of elastomer and a U-shaped flexible circuit is positioned as shown in the drawings.

Figure 4:
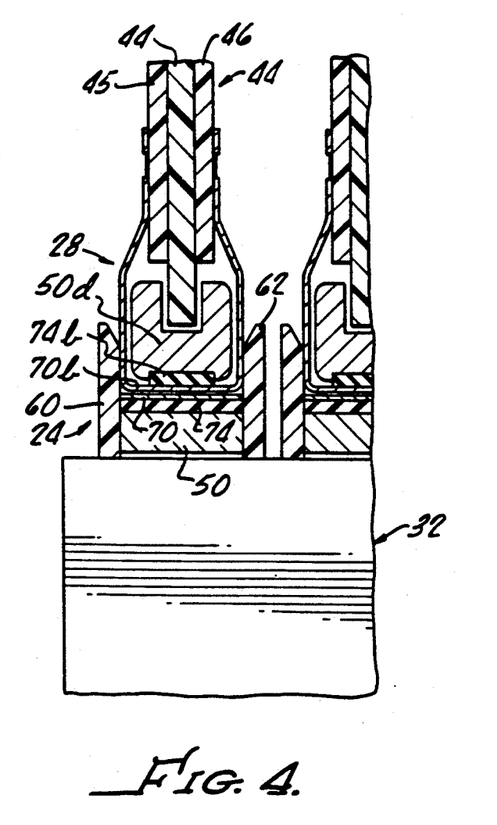
FIGS. 4 and 5 are sections of hermaphroditic interconnections of the connectors of the type shown in FIG. 3 showing first and second connectors in assembled condition.
Figure 5:
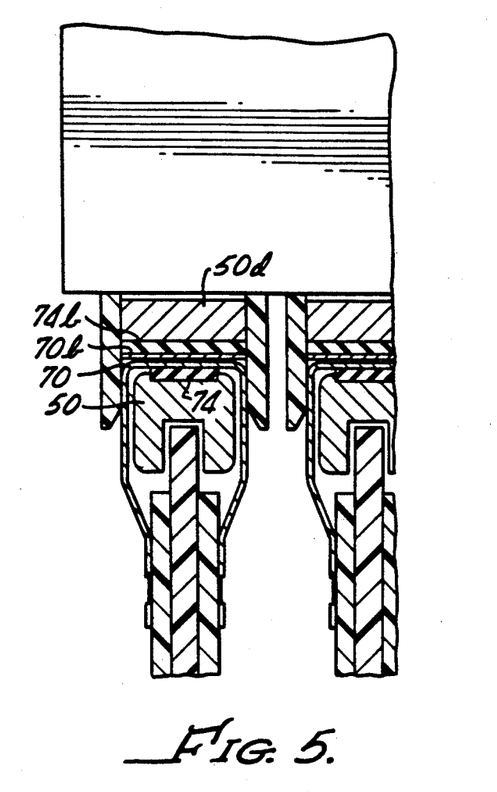

Various boards of each group are simultaneously pressed against one another in edge to edge perpendicular relation in the configuration illustrated in FIG. 2 by any suitable means, such as providing each board with a pair of conventional pivoted latching levers 96, 98, 96a and 98a (FIG. 2). The levers are pivoted on face plates 94,94a that are fixed to the boards and swing into a latching groove 97 of a common frame 99 that mounts the group of boards 20a,20b. The arrangement applies a force to each board in the plane of the board directed from the outer edge at which the latching lever is connected to the inner edge of the board which is connected electrically to the corresponding edge of boards of the other group. Any suitable known arrangement may be employed in the place of levers 96,98 to securely mount the boards of each group so that inner edges of the boards are urged in edge to edge contact against edges of the boards of the other group. Each connector engages its mating connector (as shown in FIGS. 4 and 5) with the raised contacts 76 of one in direct face to face contact with the raised contacts of its mate. As the boards are pressed together the raised contacts are resiliently (because of elastomer 74 or the described alternative springs, not shown) pressed against each other. As can be seen in FIGS. 4 and 5, the fixture body flanges of one connector engage legs of the U-shaped flex circuit of its mating connector so that the beveled free ends of the flanges help to guide the interconnecting motion and the flanges help to secure the relative positioning of the two connectors.

Figure 7:
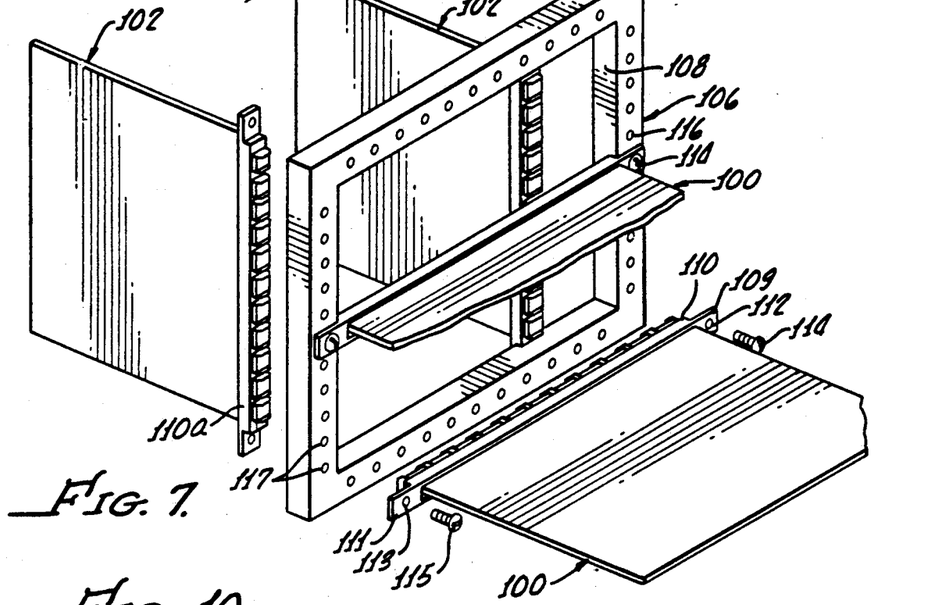
FIG. 7 illustrates a modified arrangement for interconnecting a plurality of boards in perpendicular edge-to-edge relation.

A modified hermaphroditic connector is illustrated in FIGS. 7, 8, 9 and 9a. As illustrated in FIG. 7, first and second groups of mutually parallel and mutually spaced boards 100,102 are interconnected with one another in edge to edge relation, with the boards of one group being transverse or perpendicular to the boards of the other group. All boards are secured to a thin rigid frame 106 having rectangular aperture 108 dimensioned to receive each board and to enable the boards to meet in edge to edge interconnection within the aperture 108. The boards, or more specifically their connectors, adjoin one another within the aperture between the opposite surfaces of the mounting plate 106. Each board is provided with a connector mounting bracket or housing 110,110a that is fixedly attached to the board and extends outwardly of the board on opposite ends. Outer ends 109,111 of the bracket or housing 110 are provided with apertures 112,113 to receive bolts 114,115 that are threadedly received in threaded apertures 116,117 formed in the edges of the plate 106. Connector mounting bracket 110 is one of many different ways in which the boards may be connected in edge to edge perpendicular relation and at the same time have hermaphroditic connector parts secured to the boards at the edge thereof. Brackets 110,110 etc. operate to connect the boards to the frame, and, therefore, to one another and also to mount the hermaphroditic connectors to the boards. Each bracket 110,110a is provided with a number of apertures 120,120a etc., each of which physically mounts an hermaphroditic connector of the type illustrated in FIGS. 8 and 9. The relation between one connector and its mounting aperture 120a is illustrated in the exploded view of FIG. 10.

Figures 8, 9, 9A:
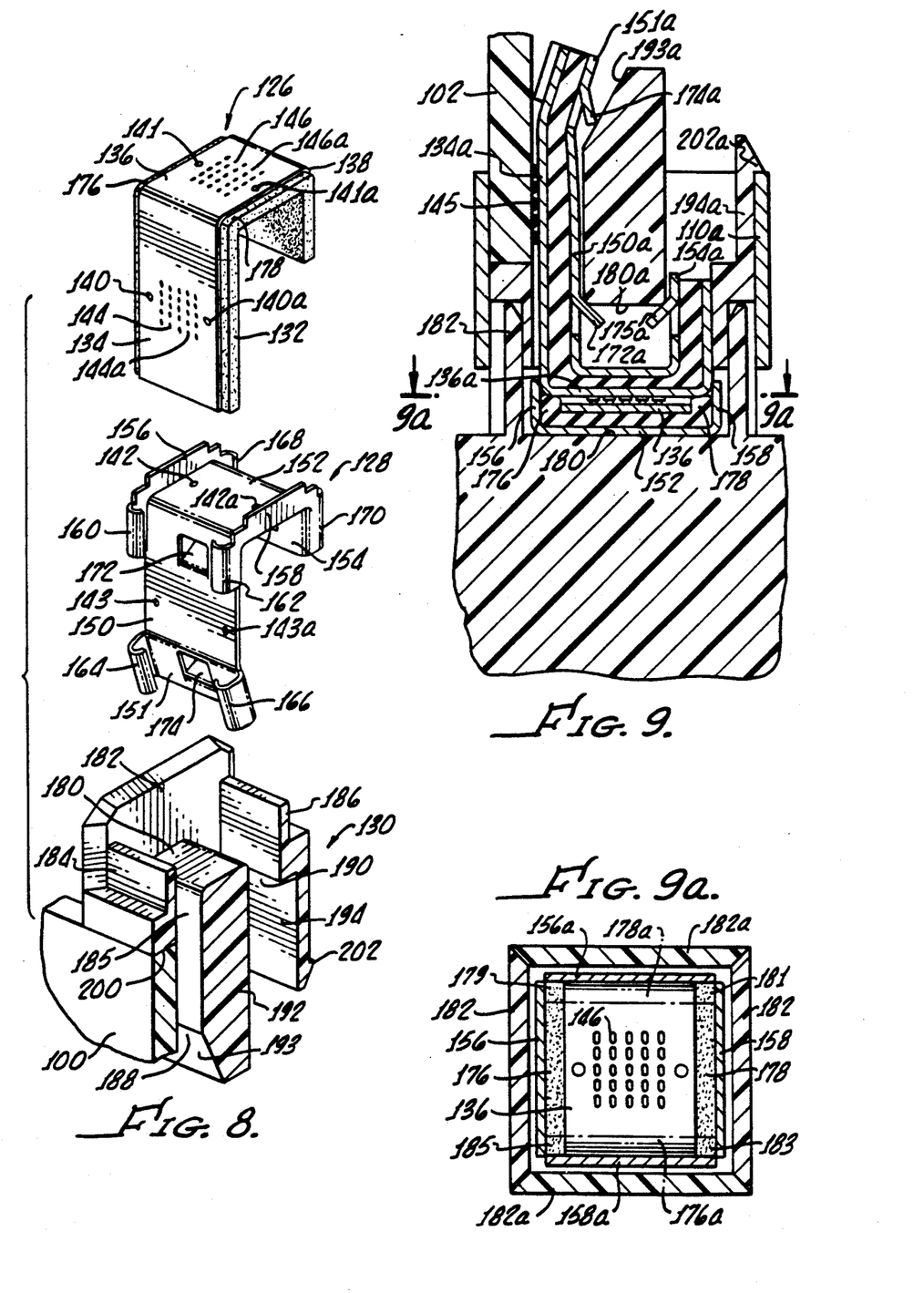
FIG. 8 is an exploded pictorial view of a modified form of an hermaphroditic connector.
FIG. 9 is a section showing an assembly of first and second parts of the hermaphroditic connector of the type illustrated in FIG. 8.
FIG. 9a is a section taken on lines 9a—9a of FIG. 9.

As shown in the exploded pictorial illustration of FIG. 8, this embodiment of an hermaphroditic connector is basically of a J-shape rather than U-shape and is used with a single sided circuit board. The J-shaped connector comprises a flexible circuit and elastomer backing generally indicated at 126, a carrier 128 and a connector fixture 130. The flexible circuit and elastomer subassembly 126 includes an elastomeric strip 132 bent into an inverted J-shape in the orientation shown in FIG. 8 upon which is mounted a flexible circuit having a relatively long board connecting section 134, a connector interconnecting section 136 and a relatively short ground plane section 138. The flexible circuit, elastomer and carrier are formed with aligned registration apertures 140, 140a, 141, 141a, 142, 142a, 143, 143a to receive registration pins (not shown) to enable alignment of the two with each other and with the carrier 128. Flex circuit board connecting section 134 includes a plurality of board connecting elements which, in this case, are illustrated as raised pressure dots 144, 144a, etc., for connection with pads 145 (FIG. 9) on the circuit board. These raised dots may be of the type described in U.S. Pat. No. 4,453,795 for Cable-to-Cable/-Component Electrical Pressure Wafer Connector Assembly and U.S. Pat. No. 4,125,310 for Electrical Connector Assembly Utilizing Wafers for Connecting Electrical Cables, or they may be elongated raised strip, as described below. Interconnecting section 136 of the flexible circuit extends substantially at right angles to the plane of board connecting section 134 and is provided with a number of raised interconnection elements 146, 146a, etc., which may be either raised dots similar to raised dots 144, 144a, or, preferably, are raised elongated conductive strip having a long dimension extending in a given direction along the interconnecting section 136. The direction of extent of these elongated conductive strip 146, 146a may be, for example, parallel to the length of the flexible circuit in its developed or straightened condition, or it may be perpendicular thereto, or it may be at some other angle, such as 45° thereto, provided only that such raised elongated conductive strip for both of the interconnecting hermaphroditic connectors of a mating pair extend in the same direction on each connector relative to the connector. Regardless of the angle, the elongated strip of one connector preferably, but not necessarily, will extend at 90° to the elongated strip of a mating connector, as will be explained more particularly below. The flex circuit includes embedded traces (not shown) that electrically connect board connecting elements 144,144a with interconnection elements 146,146a.

The metal carrier 128 is made of a resilient or spring metal, such as brass, and includes a relatively longer first leg section 150, having a slightly inwardly angulated end portion 151, an intermediate section 152 and a relatively short leg section 154 to provide a substantially inverted J-shape to receive the inverted J-shaped assembly of flexible circuit and elastomer 126. The carrier is formed with upstanding guiding and positioning flanges 156,158 on opposite sides of the intermediate section 152 and has sets of oppositely disposed crimping fingers 160, 162, 164, 166 and 168, 170 integrally formed at laterally outer edges of the legs 150 and 154, respectively. Tongues 172 and 174 are struck from the longer leg 150 and protrude inwardly of the leg. A similar tongue 175 (FIG. 9) is formed on shorter leg 154. The resilient elastomer 132 has a width slightly greater than the width of the flexible circuit to provide edge portions, such as edge portions 176,178 which extend laterally outwardly of the sides of the flex circuit interconnection section 136 for purposes to be described below. The flex circuit and elastomer 126 are mounted upon the carrier 128 and positioned by registration pins (not shown) extending through the registration holes 140,140a, etc. into corresponding holes formed in the carrier. With the parts thus registered with one another, the crimping fingers 160 through 170 are then crimped over to securely lock the flex circuit and interposed elastomer to the resilient carrier 128.

Figure 10:
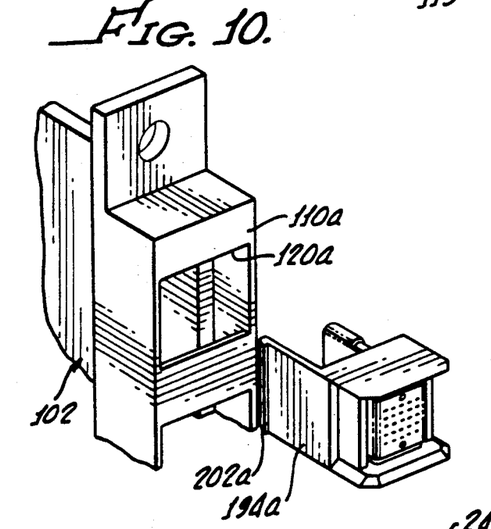
FIG. 10 is an exploded pictorial view of one connector and part of a connector mounting bracket.

The subassembly of flex circuit, elastomer and carrier is mounted upon the connector fixture 130, which is integrally molded of a resilient nonconductive plastic. The latter includes a body portion 180, having a fixed flange 182 extending upwardly from one end thereof and a pair of upstanding lateral flanges 184,186 fixed to the flange 182 and spaced from the body 180 to provide spaces 188,190 which respectively receive legs 150 and 154 of the carrier, together with the elastomer and flex circuit portions on the carrier. Fixture body 180 includes a depending leg 192 which is parallel to and spaced from a depending leg 194 that extends downwardly from the lateral flange 186. The free end of leg 192 is chamfered as at 193. Legs 192 and 194 are configured and arranged and mutually spaced so as to slide into one of the apertures 120,120a of connector mounting bracket 110 when the resilient legs 192 and 194 are pressed inwardly toward one another. A stop shoulder 200 formed on the bottom of flange 184 abuts an edge of the circuit board 100 to which the housings 110,110a are fixed. Thus, fixture 130 is inserted into the mating rectangular holes 120a of the bracket until the shoulder 200 abuts the edge of the circuit board, at which point the legs 192 and 194 snap outwardly so that hook 202a on the end of the leg 194a will snap over a lower edge of the hole 120a in the housing 110a (FIGS. 9 and 10).

The resilient carrier with its flex circuit and elastomer secured thereto has its legs 150,154 pressed downwardly into the spaces 188 and 190 of the fixture (slightly straightening bent end portion 151a) so that the bottom of the intermediate fixture section 152 is spaced from the upper surface of central fixture body 180a (FIG. 9). Inwardly projecting tongues 172,174 bear against leg 192a and tend to resiliently press the leg 150a, together with the elastomer and flex circuit connecting section 134 thereon, outwardly of the fixture, and, therefore, toward the surface of the board to which the fixture 130 and bracket 110 are connected. The board 102 is provided with raised pressure contacts 145 (FIG. 9) similar to the raised pressure dots 144,144a of the board connecting section 134 of the connector. Accordingly, the fixture 130, which is initially inserted into and secured to the bracket 110, will receive the substantially independently assembled assembly of carrier and flex circuit when the latter are inserted into the spaces 188 and 190 of the fixture. As the longer leg 150 of the carrier slides into the space 188, the resilient inwardly bent fingers or tabs 172a,174a press leg 150a of the carrier and the board connecting section 134a of the flex circuit outwardly toward the surface of the circuit board. This part of the circuit board has a pattern of raised connector dots to provide a sliding, wiping and pressure connection of the raised dots 144,144a with the corresponding raised dots 145 on the circuit board itself. Thus the hermaphroditic connector and a row of others, precisely identical thereto, are secured to a single circuit board, both mechanically and electrically, to provide a series of J-shaped hermaphroditic connectors having a first or board connecting section 134a extending substantially parallel to and electrically connected to a surface of the board, and having a second or interconnecting section 136a extending at right angles to the board connecting section 134a. In the inverted J-shape configuration of FIG. 9 interconnecting section 136a extends away from the board surface, that is, outwardly of the board, primarily because of the configuration of the fixture and its mounting bracket.

In the arrangement described in connection with the hermaphroditic connector configuration of the type shown in FIGS. 3, 4 and 5 the connector has two substantially parallel and spaced board connecting sections which are connected electrically to opposite sides of the double sided board. The connector also has an intermediate interconnecting section (section 70) that extends at right angles to the board connecting sections. In the embodiment of FIGS. 3-5 the interconnecting section extends across the board edge so that in effect the connector of FIGS. 3-5 straddles the board edge, whereas the connector of FIGS. 8 and 9 is secured to a board surface adjacent the edge and has its interconnecting section extending outwardly of the board. In either arrangement the interconnecting section extends normal to the board, at the edge of the board.

When a pair of perpendicular boards are secured to opposite sides of the mounting plate 106, the sets of raised elongated contact strips 146,146a on mating connectors are pressed against one another, with the length of the strips of one set of raised connector stripes extending in a direction perpendicular to the length of the strips of the opposing set of connector stripes. Moreover, the geometry and configuration of the parts is such that, when connected, the two sets of opposing strips are pressed against one another to compress the underlying elastomer 132, as depicted in FIGS. 9 and 9a. Compression of the elastomer is sufficient to enable the outer extending edges of the elastomer, such as edges 176,178 (FIGS. 9 and 9a) to effectively contact facing surfaces of the interconnecting section of the flexible circuit of the mating connector part.

The intermediate connector sections 136,136a are rectangular, being longer in the direction of the length of the entire strip than in its width, so that the elastomer edges 176,178 may extend above the flex circuit 136 that is mounted on the elastomer and contact the mating flex circuit interconnecting section 136a. Because the intermediate sections of the elastomer and flex circuit are rectangular, the two elastomers of a pair of mated connectors overlap each other at the corner areas identified as 179,181,183,185 in FIG. 9a, to help seal the two connectors to each other. With the first group of boards 100 mounted to one side of the plate 106, and a second group of boards 102 mounted to the opposite side of plate 106 (FIGS. 7 and 9), the identical hermaphroditic connectors of each of the groups of boards are oriented at right angles to one another, as are the groups of boards. Thus, each connector mates with and makes electrical contact with a connector on another board by means of the interconnecting raised contact strips 146,146a. Carrier 128 acts as a ground plane for the circuitry of the flexible circuit, and since the connectors of all boards are identical, there is no interposed connecting circuit between connectors. Therefore, this arrangement, like that earlier described, eliminates variable length connection between boards.

Figure 11:
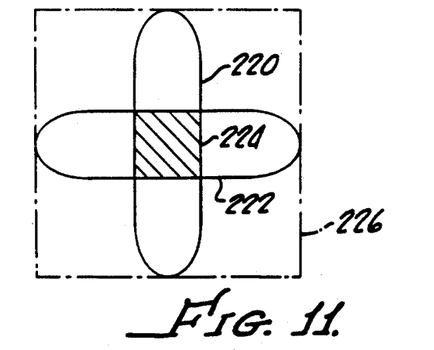
FIG. 11 illustrates interconnection of raised stripe pressure contacts on the interconnection sections of connectors.

Illustrated in FIG. 11 is an exemplary configuration of a single pair of interconnected raised elongated conductive strips. Each raised strip may have a length of 0.01 inches and a width of 0.003 inches, for example, provide a greatly increased tolerance area. FIG. 10 schematically illustrates first and second raised strips 220,222 which are, as previously described, pressed against one another in an orientation of each that is at right angles to the other. Thus, a square overlapping contact area 224 exists. Should the two connectors be misaligned or displaced in any direction relative to one another, the strips will still provide an overlapping contact section of full contact area. A tolerance zone for such mechanical misalignment of the contacts is indicated by the area within the dotted line 226 of FIG. 10. The configuration of the described hermaphroditic connector, which requires a mutually perpendicular orientation of two mating connectors, uniquely facilitates the use of raised elongated conductive strips, which also advantageously employ mutually perpendicular orientations. Although the elongated raised conductive strips are disclosed herein as used for interconnection of hermaphroditic connectors, this elongated raised conductive strip configuration can be used in many other applications, including connector to circuit board or component to circuit board connections. Moreover, only one of a pair of mutually contacting need be raised, as one raised strip may be pressed against and make good contact with a second strip (at 90° to the first strip) that is flush mounted.

Figure 12:
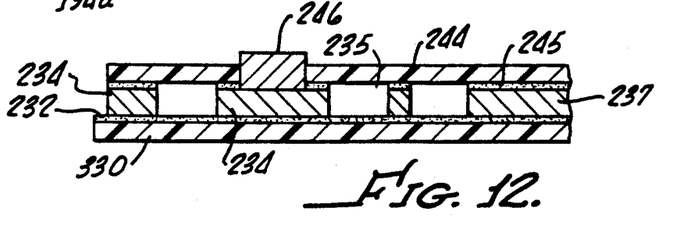
FIG. 12 illustrates a section through a flex cable carrying elongated raised contact strips.

Construction of the flexible circuit employed in each hermaphroditic connector is substantially conventional, except for the fact that raised connector elements, such as raised connector strips 146,146a, are elongated rather than square or circular dots. Thus, the typical cross-sectional area of an interconnection section of a flexible circuit, as illustrated in FIG. 12, includes a dielectric 230 secured by an adhesive 232 to electrical leads 234, 235 and 237, and a pad 240, which are formed thereon by conventional photolithographic processes. A coverlay formed of a dielectric material 244, is secured, as by adhesive 245, over the circuit traces and pads 234,235,237, and 240, and is predrilled to provide holes therein that will receive the raised pressure contact 246. The holes in the coverlay 244, which are preferably formed before the coverlay is secured to the circuitry, are then filled with the raised contact 246 that is electrolytically plated through the coverlay holes upon pad 234. Contact 246 is the counterpart of the raised contact strips, such as those indicated at 220 and 222 in FIG. 11 and the various raised contact strips 146,146a of FIG. 8 and raised contact strips 76 of FIG. 3. Thus the surface of the flexible circuit strip is covered with the dielectric 244 except for those areas at which the raised electrically conductive (copper) connecting strips 246 are provided.

The arrangement of FIGS. 3, 4 and 5 illustrates a series of hermaphroditic connectors formed on a single integral continuous fixture body, whereas the arrangement of FIGS. 8 and 9 shows a different embodiment of an hermaphroditic connector formed on a self-contained separate and independent fixture body. It will be readily understood that either embodiment of the described connectors may employ either a single continuous fixture body or a plurality of discrete connector bodies. Thus, for example, in the embodiment of FIGS. 3–5, each connector fixture for each connector may be individual and self-contained instead of having a single multi-connector integral fixture body. Similarly, instead of having individual discrete connector fixtures in the embodiment of FIG. 8. The fixture 130 may be made as one continuous group of fixtures appropriately spaced and molded together as an integral multi-connector fixture.

Although the described hermaphroditic connectors are specifically designed for edge to edge interconnection of groups of circuit boards, it will be readily understood that principles of the invention and modified configurations of the described connector may be used for interconnection of components other than circuit boards.

What is claimed is:

1. A package of interconnected circuit boards comprising:
   first and second groups of circuit boards,
      each of said groups comprising a plurality of substantially parallel boards, boards of said first group lying in planes transverse to planes in which lie boards of the second group, the boards of at least one subgroup of said first group of circuit boards having edges thereof electrically connected to an edge of a first board of the second group.

2. The package of claim 1 wherein the boards of said subgroup of said first group each has a first hermaphroditic connector fixed to an edge thereof, and wherein said first board of said second group has a plurality of second hermaphroditic connectors fixed to an edge thereof, said hermaphroditic connectors of said first subgroup of boards being electrically connected respectively to the hermaphroditic connectors of said first board.

3. The package of claim 2 wherein at least some of said hermaphroditic connectors of the first group of boards are identical to some hermaphroditic connectors of the second group of boards and are orthogonally oriented relative to connectors of said second group of boards.

4. The package of claim 2 wherein each connector of a pair of electrically connected connectors has a plurality of raised elongated connector strips extending in mutually transverse directions and pressed against one another.

5. The package of claim 2 wherein said first board has an edge and a board surface, said first board having a plurality of circuit connection elements adjacent its edge, and wherein the connector of said first board comprises a fixture connected to said first board at said edge, a flexible circuit mounted on said fixture, said flexible circuit having a first group of interconnection contacts facing outwardly of said edge and having a second group of board contacts connected to said circuit connection elements.

6. The package of claim 5 wherein said interconnection contacts comprise a plurality of elongated conductive strips projecting above the surface of said flexible circuit.

7. The package of claim 5 wherein said fixture comprises a fixture body portion positioned at said edge of said first board, said flexible circuit including a first section extending over said fixture body in a direction substantially normal to the plane of the first board and a second section extending at an angle to said first section along a surface of said first board.

8. The package of claim 7 wherein said first section of said flexible circuit includes an outer nonconductive layer and wherein said interconnection contacts comprise a plurality of elongated conductive strips projecting above said nonconductive layer.

9. The package of claim 7 including resilient means supporting said flexible circuit first section.

10. The package of claim 9 wherein said resilient means is interposed between said fixture body and said first section of said flexible circuit.

11. The package of claim 7 including a carrier on said fixture body, an elastomeric pad on said carrier, said flexible circuit being positioned on said elastomeric pad.

12. The package of claim 11 including means for securing the flexible circuit and elastomeric pad to said carrier.

13. The package of claim 12 wherein said carrier includes crimping fingers, said elastomeric pad and flexible circuit being positioned beneath said crimping fingers, said crimping fingers being crimped over and pressed against said flexible circuit and elastomeric pad.

14. A circuit board and connector assembly comprising:
a circuit board having at least one layer of circuitry, a surface having connecting elements electrically coupled with said circuitry, and having a board edge, and
connector module means for connecting the circuit board to other circuit elements, said connector module means comprising:
a fixture connected to said circuit board adjacent said edge, and
a flexible circuit extending over said fixture and having interconnection contacts facing outwardly of said edge and having board connecting contacts in contact with said connecting elements on said board surface.

15. The assembly of claim 14 wherein said flexible circuit has a first section extending perpendicular to said surface, said interconnection contacts being positioned on said first sections.

16. The package of claim 14 wherein said fixture comprises a fixture body portion positioned at said edge of said circuit board, said flexible circuit including a first section extending over said fixture body in a direction substantially normal to the plane of the circuit board and a second section extending at an angle to said first section along a surface of said circuit board.

17. The package of claim 14 wherein said interconnection comprise a plurality of elongated strips projecting above the surface of said flexible circuit.

18. An electrical connector assembly comprising:
a dielectric substrate having a surface,
means on said substrate for defining circuit traces and a pattern of first contact pads terminating said circuit traces,
a dielectric coverlay overlying said circuit traces and contact pads and having an outer surface, said coverlay having a plurality of elognated holes therein in registration with said contact pads, and
elongated strips of conductive material filling said holes and extending above the outer surface of said dielectric coverlay.

19. An electrical connector assembly comprising:
a first dielectric substrate having a plurality of electrical conductors and a pattern of first contact pads terminating said electrical conductors, each of said pads having a raised strip of conductive material thereon, each of said strips extending in a first direction,
a second dielectric substrate having a plurality of second electrical conductors and a pattern of second contact pads terminating said second electrical conductors, each of said second contact pads having a second raised strip of conductive material mounted thereon, said second raised strips extending in directions transverse to said first direction, and
means for pressing said substrates toward one another to press said raised strips against one another.

20. The connector assembly of claim 19 wherein each of said substrates includes a dielectric coverlay overlying the electrical conductors and contact pads thereon, each said dielectric coverlay having a plurality of elongated apertures therethrough, said elongated contact strips extending through and above said dielectric coverlays.

21. An electrical connector assembly comprising:
first and second circuit boards each having a surface and an edge,
a first connector having a first section extending parallel to the surface of said first board, and a second section extending transverse to said first section,
a first group of board connector elements on said first section connected to said first board,
a first group of interconnection contacts on said second section,
means on said first connector for interconnecting said first group of board connector elements with said first group of interconnection contacts,
means for securing said first connector to said first circuit board,
a second connector having a first section extending parallel to the surface of said second board and a second section extending transverse to said first section of said second connector,
a second group of board connector elements on said first section of said second connector connected to said second board,
a second group of interconnection contacts on said second section of said second connector,
means on said second connector for interconnecting said second group of board connector elements with contacts of said second group of interconnection contacts, and
means for securing said second connector to said second circuit board, said first and second groups of interconnection contacts being pressed against one another to provide electrical contact therebetween.

22. The assembly of claim 21 wherein said first and second boards lie in planes that extend transversely of each other, and including means for urging said boards toward each other in substantially edge to edge relation and for urging said interconnection elements against one another.

23. The assembly of claim 21 wherein said second section of at least said first connector extends outwardly from the surface of said first circuit board.

24. The assembly of claim 21 wherein said second section of said first connector extends across the edge of said first circuit board.

25. The assembly of claim 21 wherein said first group of interconnection contacts comprise a group of raised elongated conductive strips extending in a first direction and wherein said second group of interconnection contacts comprise raised elongated conductive strips extending in a direction transverse to said first direction and being pressed against said first group of contacts.

26. The assembly of claim 21 wherein said first and second boards lie in first and second mutually angulated planes.

27. The assembly of claim 26 wherein said first and second connectors are substantially identical to one another and are oriented at right angles to no another.

28. An hermaphroditic connector comprising:
a fixture having first and second surfaces extending transversely to one another,
a flexible circuit having a first section on said first surface and a second section on said second surface extending transversely of said first section,
a plurality of contacts on said first section for connection to an electrical part, and
a plurality of interconnection contacts on said second surface for connection to the interconnection contacts of another similar hermaphroditic connector.

29. The connector of claim 28 including resilient means interposed between said fixture and said second section.

30. The connector of claim 28 wherein said interconnection contacts are raised elongated conductive strips.

31. A pair of interconnected hermaphroditic connectors comprising first and second connectors as set forth in claim 30 wherein the connectors are oriented transversely of each other and said conductive strips are oriented transversely of each other, and means for pressing said connectors against each other.

32. The connector of claim 31 including means connected with the first section of at least one of said connectors for connecting said one connector to a surface of a circuit board.

* * * * *